US006768313B1

United States Patent
Hamai et al.

(10) Patent No.: US 6,768,313 B1
(45) Date of Patent: Jul. 27, 2004

(54) METHOD FOR DETECTING TRACKING SHORT

(75) Inventors: Yasunori Hamai, Hatukaiti (JP); Takeshi Kamada, Hagashihiroshima (JP); Hideki Miyamoto, Hiroshima (JP)

(73) Assignee: Tempearl Industrial Co., Ltd., Hiroshima (JP)

( * ) Notice: Subject to any disclaimer, the term of this patent is extended or adjusted under 35 U.S.C. 154(b) by 15 days.

(21) Appl. No.: 10/089,591

(22) PCT Filed: Sep. 27, 2000

(86) PCT No.: PCT/JP00/06669

§ 371 (c)(1),
(2), (4) Date: Jul. 30, 2002

(30) Foreign Application Priority Data

Sep. 29, 1999 (JP) .............................................. 11-276207

(51) Int. Cl.$^7$ ................................................ H01H 31/02
(52) U.S. Cl. ........................ 324/537; 324/500; 361/93.1
(58) Field of Search ................................. 324/537, 500, 324/424; 340/309.6, 398.3, 635, 638; 361/93.1, 102, 115, 116, 634, 656, 663, 673, 435

(56) References Cited

U.S. PATENT DOCUMENTS 4,811,154 A * 3/1989 Trenkler et al. ............ 361/93.1
6,256,006 B1 * 7/2001 Yamamoto et al. ......... 345/101

FOREIGN PATENT DOCUMENTS

JP  2000324676 A * 11/2000 ............ H02H/3/10
JP  2001157355 A * 6/2001 ............ H02H/3/08

* cited by examiner

*Primary Examiner*—Minh Chau
(74) *Attorney, Agent, or Firm*—Meyertons, Hood, Kivlin, Kowert & Goetzel, P.C.; Eric B. Meyertons (57) ABSTRACT

The present invention relates to method for a detecting tracking short. In some embodiments, the method may include detecting current flowing on an electric circuit. In other embodiments, the method may include calculating the frequency distribution of the variation of the current detected in a predetermined period. In an embodiment, the method may include outputting a detecting signal in case the frequency of variations included in the predetermined range satisfies a judgement reference.

14 Claims, 6 Drawing Sheets

METHOD FOR DETECTING TRACKING SHORT

BACKGROUND OF THE INVENTION

1. Field of the Invention

The present invention generally relates to a method for detecting a tracking short in an electric circuit. More particularly, the invention relates to distinguishing the normal variation of current caused by the use of several electric devices from the tracking short current.

2. Description of the Relevant Art

A tracking short may occur once a carbonized conductive passage is formed in the isolator positioned between two points of an electric circuit, current may then flow through the formed conductive passage. Then, the carbide in the passage can become over heated causing the carbonization of the isolator around the passage. As this process is repeated, the amount of current flowing between the two points in the electric circuit increases. As the current flow increases, the heat generated can finally cause a fire or burning. Such a phenomenon is called 'tracking short'. Tracking short it likely to occur especially in the outlets or plugs that have not be used for a long time, and once occurring, it is tends to develop into a fire. One conventional method for detecting the occurrence of a short in an electric circuit, is known and includes: detecting a current value in the electric circuit using a current transformer; converting the current value to a voltage value by a current-voltage converter; A/D converting the voltage value by an A/D converter; and judging whether the short has occurred or not. Judging whether the short has occurred or not is performed by: summing up the A/D converted values only for the predetermined period by an integrate circuit; comparing the sum with the predetermined reference value; and outputting the signal indicating the occurrence of a short when the sum exceeds the reference value.

A second conventional method for detecting the occurrence of a short in an electric circuitis by detecting a current value at every unit time and judging whether the short has occurred or not on the basis of the variation of the absolute value of the current value. In this method, for example, when the second current value is smaller than the first current value and the third current value is bigger than the second current value, the signal indicating the occurrence of a short is produced.

However, according to the first conventional method, as only the current values for the predetermined period are summed up, it is necessary to set the reference value smaller than the summed value to detect a relatively small short current such as in case of tracking short. In case of a general short of two wires getting in touch with each other, the short current flowing between two wires is over several hundreds Ampere. In the contrary, in case of a tracking short, the short current is several Ampere to about several scores Ampere. Therefore, in this conventional method, the reference value has to be below several Ampere to about several scores Ampere to detect the tracking short. However, occasionally several Ampere to about several scores Ampere of sudden over-current could flow in an electric appliance like an incandescent lamp. It is difficult to distinguish such a sudden over-current from an electric appliance from the tracking short current. For example, in an incandescent lamp of 20 Ampere rated current, the sudden over-current could be up to 200 Ampere.

Further, according to the second conventional method, in the case of using several household electric appliances simultaneously, the variation of current value of each appliance is mixed up. When the variation of current value is mixed it could show the same amount of variation that appears in a tracking short. Therefore, it is still difficult to detect the tracking short without error from the current caused by the use of several household electric appliances.

As described above, according to the conventional methods, it is very difficult to detect a tracking short without error. It is because the current caused by a tracking short is almost the same as the current caused by the normal use of electric appliances.

SUMMARY OF THE INVENTION

It is an object of the invention to provide a method for detecting tracking short without error by distinguishing the tracking short current from the current caused by the normal use of electric appliances or electric devices.

The following comparison test was performed. The test was for comparing frequency distribution of current variation caused by a tracking short in a plug with that of a current variation caused by the normal use of several kinds of household electric appliances.

A predetermined period of time was set at about 0.2 sec. A unit of time was obtained by dividing the predetermined period into 7 parts, and a current value obtained at every unit time is the absolute value of the peak value of current in the unit time.

Whenever obtaining the current value, it was compared with a current value obtained at previous unit time and the difference between them recorded as the variation for each unit time. By repetition of the above process, a frequency distribution of variation was determined. The frequency distribution of variation was then compared to the case of a tracking short with the case of the normal use of household electric appliances.

A tracking short was intentionally formed by carbonizing the insulator between tracking electrodes in advance and supplying a AC(100V) power. Then, the waveform of current right after the occurrence of the tracking short was observed.

In addition, the waveform of the current was observed when the power was turned on with the rated voltage of several kinds of household electric appliance.

Figure 2:
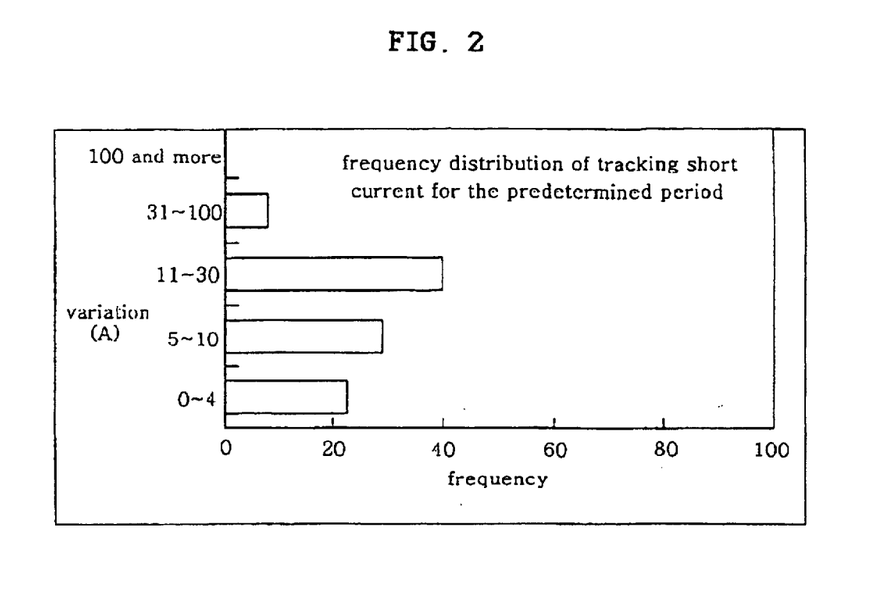
FIG. 2 is a graph illustrating the exemplary frequency distribution o current variation in case the tracking short occurs.
Figure 6:
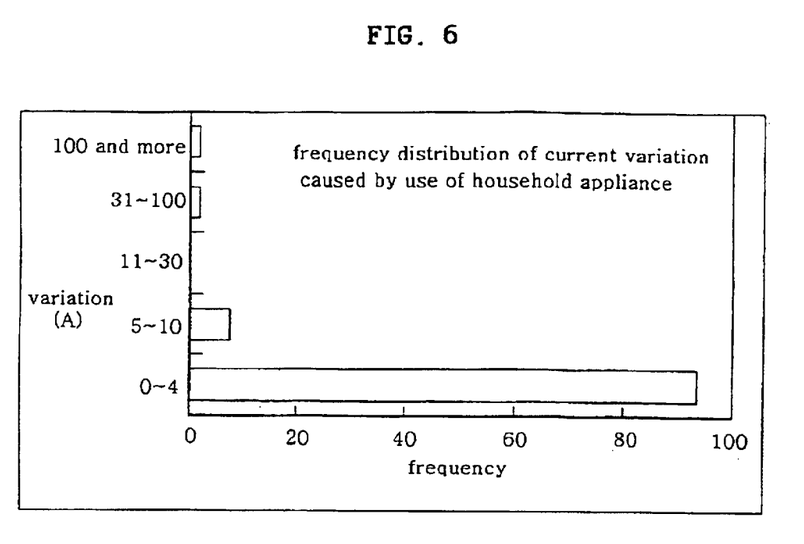
FIG. 6 is a graph illustrating the exemplary frequency distribution of current variation in case of the household electric appliance.

FIG. 2 and FIG. 6 resulted from the experiments showing the frequency distribution of current variation. In FIG. 2 and FIG. 6, the vertical axis indicates the variation (Ampere) at each unit time, and the horizontal axis indicates the rate (%) of the summed value of frequencies in each variation range over the total sum of frequencies in the predetermined period.

FIG. 2 shows the frequency distribution of current variation in case of the occurrence of a tracking short. FIG. 6 shows the frequency distribution of current variation for the appliance showing the biggest variation among the several kinds of household electric appliance.

In comparison of FIG. 2 with FIG. 6, FIG. 2 shows that the variation is mostly concentrated in the range of 0~4 Ampere, and FIG.6 shows that although it generally spreads broadly, the variation in the range of 5~30 Ampere is a little more than that in other ranges.

The method described herein is achieved on the basis of the result of the above test for the purpose of detecting a tracking short. The described method takes advantage of the fact that the frequency distribution of the current variation in the tracking short shows a characteristic feature.

In an embodiment, a method for detecting tracking short with the current value on the electric circuit may include: measuring the current value during the predetermined period to obtain the frequency distribution of the absolute value of current variation; comparing the rate of the frequencies in a predetermined range over the total frequency with reference value; and judging a tracking short to have occurred when said rate is above the reference value.

In some embodiments, a method may be applied to detect the occurrence of a tracking short. The method may further make it possible to detect the tracking short without error by taking advantage of the frequency distribution of current variation as a judgment condition.

In certain embodiments, a method may be provided for detecting a tracking short with the current value on an electric circuit. The method may include measuring the absolute current value at each unit time to obtain the current waveform. The current waveform may be use for judging the occurrence of the tracking short. The unit time may be obtained by dividing a predetermined period into several. The method may include calculating the variation of the current value at each unit time by getting the difference between the absolute current value at each unit time and the absolute current value of the previous or next unit time. The method may include judging a tracking short to have occurred when the frequency in the predetermined variation range for the predetermined period satisfies the pre-set reference.

In certain embodiments there may exist a plurality of variation ranges, and a reference of frequency is set for each plurality of ranges. The judgment step may judge the occurrence of a tracking short when each frequency in all the ranges satisfies the corresponding reference.

In some embodiments, a method for detecting a tracking short may include performing a judgment at every unit time during the predetermined period.

In other embodiments, the method may include: dividing the predetermined period into several unit times; performing the judgment step at every unit time; and outputting the result. In addition, the method may include erasing an oldest datum of past predetermined period at every unit time.

In other embodiments, a method may include: dividing the unit time into several; obtaining the absolute value of the peak value of the current in every said divided time; and calculating the difference between each said obtained value and previous or next value of it. The method may further include initializing and restarting the judgment step when the absolute value of the difference is below the predetermined reference value. An advantage may be providing more errorless method for detecting tracking short. More specifically, it may be possible to protect against error far better by further dividing the unit time into several parts and giving a corresponding judgment condition to each part. The reason being because it is often that the current variation exceeds the reference value only for pretty short time in case of tracking short.

BRIEF DESCRIPTION OF THE DRAWINGS

Other objects and advantages of the invention will become apparent upon reading the following detailed description and upon reference to the accompanying drawings.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

A method for detecting a tracking short is characterized in detecting current in an electric circuit and judging the occurrence of a tracking short on the basis of the variation of the detected current for a predetermined time.

Figure 1:
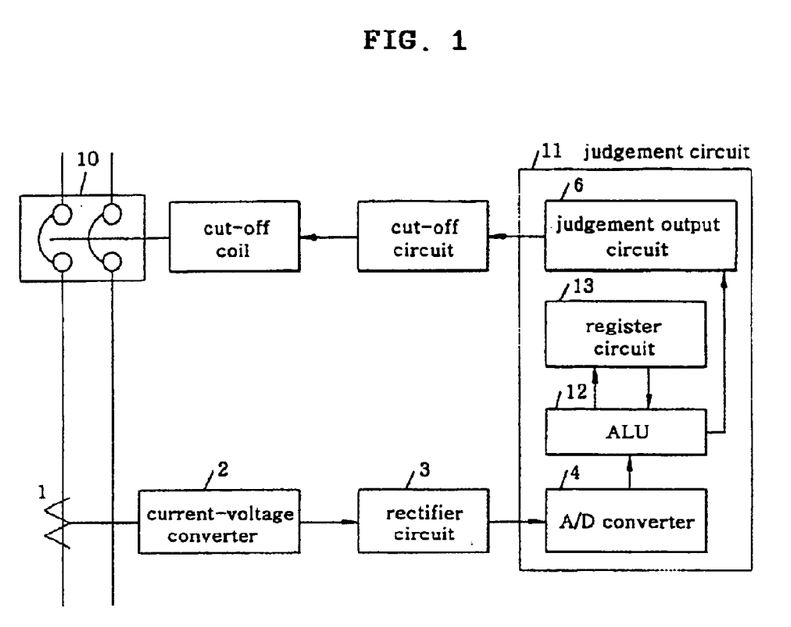
FIG. 1 is a block diagram illustrating the configuration of the circuit.

Referring to FIG. 1, there is shown a block diagram showing the configuration of the circuit of one embodiment in, for example, a circuit breaker. As shown in FIG. 1, the circuit breaker of the embodiment may include current transformer 1, current-voltage converter 2, rectifier circuit 3 and judgment circuit 11.

Current transformer 1 may detect current flowing in electric circuit 10 and outputs AC current.

Current-voltage converter 2 may convert the AC current outputted from current transformer 1 into AC voltage, particularly through a resistor.

Rectifier circuit 2 may rectify the output voltage from current-voltage converter 2 using diodes etc. and output the absolute value of it. By using the absolute value, when an A/D converter digitalizes the voltage, a higher resolution can be obtained than in a case not using the absolute value.

Judgment circuit 11 may be adapted to observe the output voltage from rectifier circuit 3. Judgment circuit 11 may further judge whether the current is corresponding to a tracking short or not. In case a tracking short occurs, judgment circuit 11 may output a cut-off command signal to the cut-off circuit so that a cut-off coil opens the contact of the circuit breaker.

Judgment circuit 11 may include a microcomputer including A/D converter 4, ALU 12, register circuit 13, and judgement output circuit 6.

A/D converter 4 may digitalize the output voltage from rectifier circuit 3 by dividing the voltage into a predetermined time width (sampling time). The predetermined time width may be several milli second or below. For example, the sampling time can be about 0.25 ms.

For example, when the maximum input voltage of A/D converter 4 is 5V, and the resolution of the digitalization is 8 bit, the output of A/D converter 4 is 0for 0V of input voltage, 127 for 2.5V, and 255 for 5V. By adjusting current-voltage converter 2 so that the current of 1 bit is corresponding to 1A when A/D converting, it may be possible to observe the current waveform of 0A~+255A with A/D converter 4. Further, as the means for digitalization, ALU 12 equipped with A/D converter 4 inside can be used.

ALU 12 may process the current variation numerically on the basis of A/D converted value by A/D converter 4, and outputs the current variation data to register circuit 13. Further, ALU 12 may read out the variation data stored in register circuit 13, an may perform the judgment of the occurrence of a tracking short according to a built-in program. ALU 12 may output the result signal to judgment output circuit 6 in case the tracking short occurs.

Register circuit 13 may retain a plurality of current variations for the recent predetermined period in time by erasing the oldest current variation while simultaneously writing in the latest current variation whenever the new current variation is transmitted from ALU 12. The number of current variations retained in register circuit 13 should be more than 7 for improved accuracy of judgment. The number of current variations retained can be decided according to the capacity of the memory in the microprocessor and the length of judgment time.

In certain embodiments, judgment output circuit 6 may receive the judgment signal from ALU 12 and output a signal to a cut-off circuit.

ALU 12 may extract the peak value of current at every half-wavelength from the data of each sampling time transmitted from A/D convertor 4. In addition, ALU 12 may compare it with the previous peak value, and may transmit the difference of the two values to register circuit 13 as a current variation. Register circuit 13 may store the current variation data of the predetermined period. When receiving the new data from ALU 12, register circuit 13 may erase the oldest data while writing in the latest data. Herein, the predetermined period may be about 0.2 sec.

ALU 12 may transmit the latest data to register circuit 13 and take the current variation data from register circuit 13. In addition, ALU 12 may calculate the frequency distribution of the variation such as shown in FIG. 2 with the variation of the each data, and calculate the sum of frequencies in the predetermined variation range and the total frequency. ALU 12 may also calculate the rate of the sum of frequencies in the predetermined variation range over the total frequency, and judge whether the rate is above the judgment reference or not.

Referring to FIG. 6, there is shown an exemplary frequency distribution of the current variation when household electric appliance are used. It is shown that the frequency of variation is concentrated in the range of 0~4 A. On the contrary, FIG. 2 is an exemplary frequency distribution of the current variation in case of a tracking short, and it is shown that the most frequency of variation exists in the range of 5~30A. Therefore, by way of calculating what percentage the frequencies in the variation range of 5~30A occupies within the chosen range of total frequency and judging whether it exceeds the judgment reference or not, it may be possible to judge exactly whether the flowing current is caused by the use of household electric appliance or by a tracking short even though the magnitude of the flowing currents in both cases are almost same.

Herein, the judgments by ALU 12 may be performed on the basis of the data for the predetermined period. The predetermined period may be about 0.2 sec.

Figure 3:
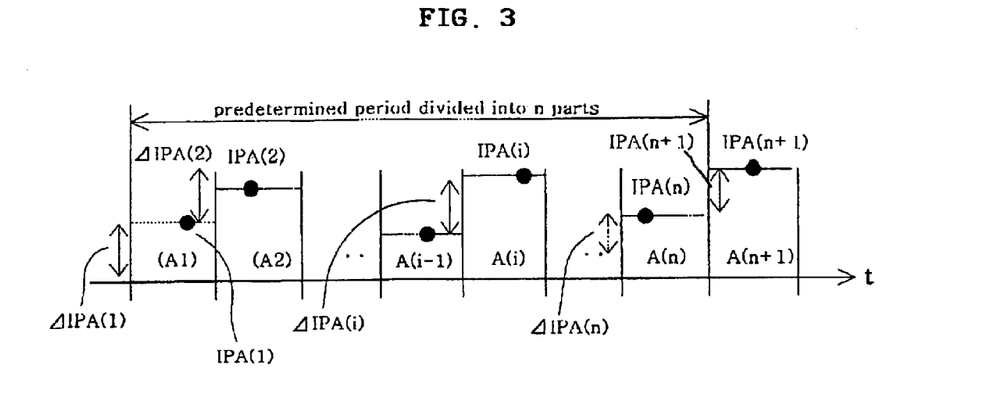
FIG. 3 is for explanation of the detecting method.

FIG. 3 depicts an explanation of unit time A(i), detected current value IPA(i) at each unit time, current variation $\Delta$IPA(i), and a predetermined period. The predetermined period may be divided into a plurality of unit times A(i) (here, i=1~n, n is a positive number). IPA(i) may be a current value that ALU 12 extracts in the unit time A(i) from the data transferred from A/D convertor 4 in FIG. 1 at every sampling time. Although, in this embodiment, said IPA (i) is a peak value in the unit time A(i), it can be an average value in the unit time A(i). $\Delta$IPA(i) is a variation corresponding to the difference of a current value in the unit time and a current value in the right previous unit time. It can be expressed as the difference of IPA(i) and IPA(i−1).

Referring to FIG. 3, register circuit 13 may retain n data of $\Delta$IPA(1) ~$\Delta$IPA(n) and a datum of IPA(n). The initial status of said data may be set zero.

A/D convertor 4 may transmit the data at each sampling time to said ALU 12. ALU 12 may extract the peak value IPA(n+1) of current in the unit time A(n+1) while simultaneously reading the previous peak value IPA(n) from register circuit 13.

ALU 12 may calculate the $\Delta$IPA(n+1) by the following equation:

$$\Delta IPA(n+1)=IPA(n+1)-\Delta IPA(n).$$

In addition, ALU 12 may transmit the new value of $\Delta$IPA(n+1) and IPA(n+1) back to register circuit 13, wherein if the $\Delta$IPA(n+1) is negative, making it positive before transmission.

Figure 4:
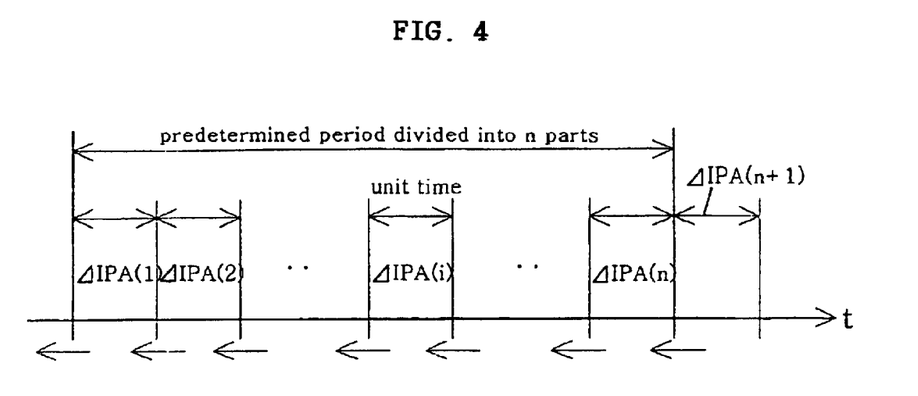
FIG. 4 is for explanation of the detecting method.

Register circuit 13 may be already retaining n data of $\Delta$IPA(1)~$\Delta$IPA(n) and a datum of IPA(n) as shown in FIG. 4 even before receiving the $\Delta$IPA(n+1) from ALU 12. Therefore, if receiving the new data of $\Delta$IPA(n+1) and IPA(n+1) from ALU 12, register circuit 13 erases the oldest data of $\Delta$IPA(1) and IPA(n) and shifts the value of $\Delta$IPA(2) to $\Delta$IPA(1), $\Delta$IPA(3) to $\Delta$IPA(2) . . . $\Delta$IPA(n+1) to $\Delta$IPA(n) and IPA(n+1) to IPA(n). ALU 12 may also read out the renewed n data of $\Delta$IPA(1) ~$\Delta$IPA(n) from register circuit 13. In addition, ALU 12 may calculate the sum of the number of data in the range of 5~30A of $\Delta$IPA(i) as a frequency. ALU 12 may output the judgment signal indicating the occurrence of a tracking short to the judgment output circuit in case the frequency is more than nX0.7. An advantage of this method may be it makes it possible to judge whether the tracking short occurs or not with the simpler judgment procedure of just comparing the sum of data in the predetermined range with the reference. As opposed to method wherein the ALU 12 makes the frequency distribution and calculates the rate.

In some embodiments, in addition to a judgment condition about the number of data of which current variation is in the range of 5~30A, having another condition that the number of data of which current variation is in the range of 11~30A is above nX0.4, the judgment that the tracking short has occurred is issued when the both of conditions are satisfied. This make it possible to increase the accuracy of distinguishment between the current due to a tracking short and the current due to the use of household electric appliance.

In certain embodiments, the unit time A(i) is further divided into m parts Ta(i,1) ~Ta(i,m)(m is a positive number). In this embodiment, Ta(i,j) is a corresponding time to the half-wavelength of the frequency of commercial AC power. As a cycle could be 50 Hz or 60 Hz according to the area, it may be set to a middle value, that is, about 9 ms.

Figure 5:
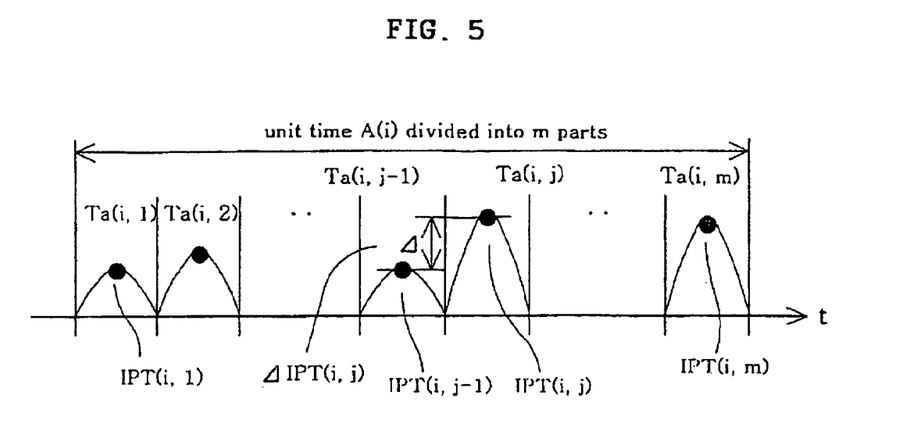
FIG. 5 is for explanation of the detecting method.

In FIG. 5, IPT(i,j) is the peak value of the current in a divided time Ta(i,j), and $\Delta$IPT(i,j) is the value obtained by subtracting IPT(i,j−1) from IPT(i,j). ALU 12 may receive the data from A/D converter 4 at every sampling time and may extract the peak value of current IPT(i,j) in each divided time. ALU 12 may calculate the $\Delta$IPT(i,j) with the previous peak value IPT(i,j−1) by the following equation.

$$\Delta IPT(i,j)=IPT(i,j)-IPT(i,j-1)$$

Herein, if the $\Delta$IPT(i,j) is negative, it is converted to positive.

At the same time, ALU 12 may calculate $\Delta IPT(i,j)$ for each divided time $Ta(i,1) \sim Ta(i,m)$. If the $\Delta IPT(i,j)$ is above the predetermined value (for example, it is set 5A in this embodiment), ALU 12 proceeds to calculate the next $\Delta IPT(i,j)$. If the next $\Delta IPT(i,j)$ does not satisfy the predetermined value, ALU 12 may initialize all the procedure and begin the judgment procedures again from the first stage.

More specifically, if all the values of $\Delta IPT(i,2) \sim \Delta IPT(i,m)$ in the unit time $A(i)$ are above the predetermined value, ALU 12 continues the procedure of extracting the peak value of the current $\Delta IPT(i)$ in the unit time $A(i)$. ALU 12 may obtain the current variation $\Delta IPT(i)$ by calculating the difference between $\Delta IPT(i)$ and $IPT(i-1)$, and transmitting it to register circuit 13. However, otherwise, all the data in register circuit 13 may be initialized. Therefore, for ALU 12 to judge that the flowing current is caused by a tracking short and output a signal to judgment output circuit 6 in FIG. 6, it may be necessary to satisfy two conditions at the same time. One condition may be that all the values of $\Delta IPT(i,2) \sim \Delta IPT(i,m)$ illustrated in FIG. 5 are above the predetermined value and the procedure is being continued. The other condition may be that the current variation in each unit time $A(1) \sim A(n)$ satisfies the condition that when a frequency of the variation in a predetermined range for the predetermined period satisfies a pre-set reference or when each frequency in all the ranges satisfies the corresponding reference. In a tracking short, most of the above $\Delta IPT(i,j)$ can be sustained above the predetermined value, therefore, it may be possible to judge more exactly whether the current flowing on a circuit is caused by a tracking short or by a malfunction.

As described above, the present invention is described through the embodiments applying to the circuit breaker configured to breaks the circuit when detecting the occurrence of a tracking short. But, the present invention is not restricted to the circuit breaker, and it can be applied to outlets or it can be configured to alarm using a output signal of the judgement circuit 11.

Industrial Applicability

According to the method and system described herein, by taking advantage of the current variation in judgment of the occurrence of a tracking short, it becomes possible to judge exactly whether a tracking short has occurred or not. It is also possible to determine the occurrence of a tracking short even though the currents caused by a tracking short and by normal usage of electric devices are almost the same. In addition, it becomes possible to discriminate a tracking short without error by taking advantage of the characteristic current variation even though there occurs a load current or sudden overcurrent, or a plurality of household electric appliance are in use. Therefore, if the method and/or system described herein is applied to a device connected to the power line for a home or a factory, system/method can be used to assist I preventing a tracking short from causing a fire.

What is claimed is:

1. A method for detecting a tracking short in an electric circuit comprising:

measuring an absolute value of a current value at each unit time to obtain a current waveform, wherein said absolute value is used for a judgment, and the unit time is obtained by dividing a predetermined period into several divided time units;

calculating a variation of the current value at each unit time comprising getting the difference between an absolute value at each unit time and an absolute value at an adjacent unit time, and judging tracking short to have occurred when a frequency of the variation in a predetermined range for the predetermined period satisfies a pre-set reference.

2. A method for detecting a tracking short according to claim 1, wherein there exist a plurality of ranges of the variation of the current value, and said reference of frequency is set respectively for each of said plurality of ranges, and wherein the said judgment is judging the tracking short to have occurred when each frequency in all the ranges satisfies the corresponding reference.

3. A method for detecting tracking short according to claim 2, wherein the judgment is performed at every unit time for a predetermined period.

4. A method for detecting tracking short according to claim 3, further comprising dividing the unit time into several divided time units, obtaining an absolute value of a peak value of current in each said divided time unit, calculating a difference between said value and the previous or next value of it, and initializing and restarting the said judgment when the absolute value of said difference is below a predetermined reference value.

5. A method for detecting tracking short according to claim 2, further comprising dividing the unit time into several divided time units absolute value of a peak value of current in each said divided time unit, calculating a difference between said value and the previous or next value of it, and initializing and restarting the said judgment when the absolute value of said difference is below a predetermined reference value.

6. A method for detecting tracking short according to claim 1, wherein the judgment is performed at every unit time for the predetermined period.

7. A method for detecting tracking short according to claim 6, further comprising dividing the unit time into several divided time units, obtaining an absolute value of a peak value of current in each said divided time unit, calculating a difference between said value and the previous or next value of it, and initializing and restarting the said judgment when the absolute value of said difference is below a predetermined reference value.

8. A method for detecting tracking short according to claim 1, further comprising dividing the unit time into several divided time units, obtaining an absolute value of a peak value of current in each said divided time unit, calculating a difference between said value and the previous or next value of it, and initializing and restarting the said judgment when the absolute value of said difference is below a predetermined reference value.

9. A method for detecting a tracking short in an electric circuit comprising:

measuring an absolute value of a current value at each unit time to obtain a current waveform, wherein said absolute value is used for a judgment, and the unit time is obtained by dividing a predetermined period into several divided unit times;

calculating a variation of the current value at each unit time;

and judging tracking short to have occurred when a frequency of the variation in a predetermined range for the predetermined period satisfies a pre-set reference; wherein the judgment is performed at every unit time for the predetermined period.

10. A method for detecting tracking short according to claim 9,
wherein calculating a variation of the current value at each unit time comprises getting the difference between an absolute value at each unit time and an absolute value at an adjacent unit time.

11. A method for detecting a tracking short according to claim 10,
   wherein there exist a plurality of ranges of the variation of the current value, and said reference of frequency is set repectively for each of said plurality of ranges;
   and wherein the said judgment is judging the tracking short to have occurred when each frequency in all the ranges satisfies the corresponding reference.

12. A method for detecting tracking short according to claim 10, further comprising dividing the unit time into several divided time units, obtaining an absolute value of a peak value of current in each said divided time unit, calculating a difference between said value and the previous or next value of it, and initializing and restarting the said judgment when the absolute value of said difference is below a predetermined reference value.

13. A method for detecting a tracking short according to claim 9,
   wherein there exist a plurality of ranges of the variation of the current value, and said reference of frequency is set repectively for each of said plurality of ranges;
   and wherein said judgment is judging the tracking short to have occurred when each frequency in all the ranges satisfies the corresponding reference.

14. A method for detecting tracking short according to claim 9,
   further comprising dividing the unit time into several divided time units, obtaining an absolute value of a peak value of current in each said divided time unit, calculating a difference between said value and the previous or next value of it, and initializing and restarting the said judgment when the absolute value of said difference is below a predetermined reference value.

* * * * *